United States Patent
Azimane

(10) Patent No.: US 7,536,610 B2
(45) Date of Patent: May 19, 2009

(54) METHOD FOR DETECTING RESISTIVE-OPEN DEFECTS IN SEMICONDUCTOR MEMORIES

(75) Inventor: Mohamed Azimane, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 910 days.

(21) Appl. No.: 10/892,696

(22) Filed: Jul. 15, 2004

(65) Prior Publication Data

US 2005/0216799 A1    Sep. 29, 2005

Related U.S. Application Data

(60) Provisional application No. 60/556,706, filed on Mar. 26, 2004.

(51) Int. Cl.
*G11B 20/18* (2006.01)
*G11C 29/00* (2006.01)
*G11C 7/22* (2006.01)

(52) U.S. Cl. .................. 714/700; 714/718; 365/201

(58) Field of Classification Search .............. 714/700, 714/718; 365/201
See application file for complete search history.

(56) References Cited

U.S. PATENT DOCUMENTS

| 5,621,739 | A | * | 4/1997 | Sine et al. .............. 714/724 |
| 5,787,092 | A | * | 7/1998 | Jaynes et al. ............ 714/724 |
| 5,936,977 | A | * | 8/1999 | Churchill et al. .......... 714/26 |
| 6,829,728 | B2 | * | 12/2004 | Cheng et al. ............. 714/30 |
| 2002/0059543 | A1 | * | 5/2002 | Cheng et al. ............. 714/30 |

* cited by examiner

*Primary Examiner*—Cynthia Britt
(74) *Attorney, Agent, or Firm*—Peter Zawalski

(57) ABSTRACT

The present invention relates to a method for detecting delay faults in a semiconductor memory. In an example embodiment, address bits and data bits are generated according to a test pattern suitable for testing the semiconductor memory. The address bits and the data bits are validated and then provided to input ports of the semiconductor memory. Memory operation is then started such that a time interval between the provision of the address bits and the data bits and the start of the memory operation is approximately equal to an operating clock cycle of the semiconductor memory. Such timing ensures that both the address decoder and the read/write circuitry are stressed in time appropriately, enabling detection of small delay faults.

19 Claims, 6 Drawing Sheets

METHOD FOR DETECTING RESISTIVE-OPEN DEFECTS IN SEMICONDUCTOR MEMORIES

PRIORITY OF EARLIER APPLICATION

This application claims priority of provisional patent application titled, "A New Efficient Solution to Cover Resistive-Open Defects for Semiconductor Memories," (S/N 60/556,706) filed on Mar. 26, 2004 and is incorporated by reference in its entirety.

FIELD OF THE INVENTION

The present invention relates to the field of testing of semiconductor memories and in particular, to a method for resistive-open defects in semiconductor memories.

BACKGROUND

Systematic and automatic testing of integrated circuits becomes increasingly important. With each new generation of integrated circuits component density, number of system functionalities, and clock speed are substantially increased. Integrated circuits have reached such complexity and speed that process defects are no longer detectable using even the most exhaustive and expensive conventional testing procedures. However, customers will not accept products that show their hidden defects in operational use, thereby rendering, for example, life support systems or aircraft control systems unreliable.

At the present time, embedded semiconductor memories are operating at high speed with clock cycles reaching 2 ns for SRAMS, or even less for the new generation of CMOS whose critical dimensions are on the order of 90 nanometers. Testing of the embedded semiconductor memories is generally performed by Built-In-Self-Test (BIST) or a tester using scan test mode. In the BIST—or the tester—consecutive test patterns are generated to perform read and write operations at the memory, according to a predetermined March test. The march test is well known in the art and is often considered a sufficient test for semiconductor memories.

Resistive open defects not only cause static faulty behavior of the semiconductor memory, which is easily detected, but also dynamic faulty behavior known as "slow to rise" and "slow to fall" either in the data path or the address path. Depending on the resistance of the defect—defect size—the delays vary considerably. Big delays resulting in static faulty behavior are easily detected. The detection of small delays corresponding to small sized defects requires high speed testing using the BIST or scan test. Ideally, the semiconductor memories need to be tested at their operating frequency. If a semiconductor memory is not tested at the operating frequency, small sized resistive open defects are not detected even with the correct test patterns applied. However, a high speed BIST is not easily incorporated into the memory layout, because of the delay needed for the output analyzer of the BIST, the extra time needed for the synthesis, and the additional area needed for the high speed BIST. Increasing the speed of the BIST implies a substantial increase in area for the BIST, which is unacceptable for most applications. Furthermore, testing embedded semiconductor memories using scan test mode needs additional test time due to scan-in and scan-out of the data, which is done in series, and, therefore, substantially increases the test time for big memories with a high number of pins.

As modern fabrication process change from aluminum-based interconnect to a copper-based interconnect, resistive-open defects are becoming the dominant defects. For example, in an aluminum process, resistive metal bridging is more prevalent than resistive opens. In contracts, in a copper process, resistive opens are more prevalent.

However, as outlined above, testing at frequencies below the operating frequency of a semiconductor memory may result in undetected delay faults such as those manifested by resistive open defects, resistive bridges, and capacitive coupling.

There is a need to provide a method for reliably detecting delay faults in new generation semiconductor memories using a BIST or tester operating at a lower frequency than the operating frequency of the semiconductor memory.

SUMMARY OF THE INVENTION

The present invention has been found useful in detecting resistive-open defects in semiconductor memories. These resistive-open defects manifest themselves as delay faults leading to slow-to-rise and slow-to-fall behavior at the memory address decoder, the pre-charge circuits, the write data lines, the global inputs/outputs, and also in the memory cell matrix.

Through the use of a BIST (built-in-self-test) or a test operating at lower frequencies than the operating frequency of the semiconductor memory, the invention provides a reliable method for detecting these delay faults.

In an embodiment according to the present invention, invention there is a method for detecting delay faults in a semiconductor memory. The method comprises generating address bits and data bits according to a test pattern suitable for testing the semiconductor memory. The address bits and data bits are validated. The address bits and data bits are provided to input ports of the semiconductor memory. In dependence upon the address bits, memory operation is started, wherein a time interval between the provision of the address bits and the data bits and the start of the memory operation is approximately equal to an operating clock cycle of the semiconductor memory.

In another embodiment according to the present invention there is further provided a method for detecting delay faults in a semiconductor memory. The method comprises generating address bits and data bits according to a test pattern suitable for testing the semiconductor memory. The address bits and data bits are validated. The address bits and the data bits are provided to the input ports of the semiconductor memory. In dependence upon the address, wherein a time interval between the provision of the address bits and the data bits and start of the write operation is approximately equal to an operating clock cycle of the semiconductor memory, the data bits are written into the semiconductor memory. According to the test pattern, second address bits are generated. The second address bits are validated. In dependence upon the second address bits, wherein a time interval between the provision of the address bits and start of the read operation is approximately equal to an operating clock cycle of the semiconductor memory, the second data bits out of semiconductor memory are read. The second data bits are compared with predetermined data to obtain a comparison result and if the comparison result is indicative of a match indicating that the operation was fault free.

In yet another embodiment according to the present invention there is provided a test circuitry for detecting delay faults in a semiconductor memory comprising address and data generating circuitry for generating address bits and data bits according to a test pattern suitable for testing the semiconductor memory. There is validation circuitry for validating the address bits and the data bits. Connecting circuitry in communication with the semiconductor memory for provides the address bits and the data bits to the semiconductor memory. Timing circuitry for provides a time signal for timing the provision of the address bits and the data bits and start of the memory operation such that a time interval between the provision of the address bits and the data bits and the start of the memory operation is approximately equal to an operating clock cycle of the semiconductor memory.

The above summaries of the present invention are not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

DETAILED DESCRIPTION

In the following the invention will be described in connection with the BIST for simplicity. As will become evident, the invention also may be implemented using a tester in scan test mode.

The frequency of the BIST has a significant impact on the delay fault detection. High speed testing increases detection of delay faults by detecting small delay faults caused, for example, by resistive open defects. However, implementation of the BIST at high testing frequency is not feasible in most applications.

Figure 2:
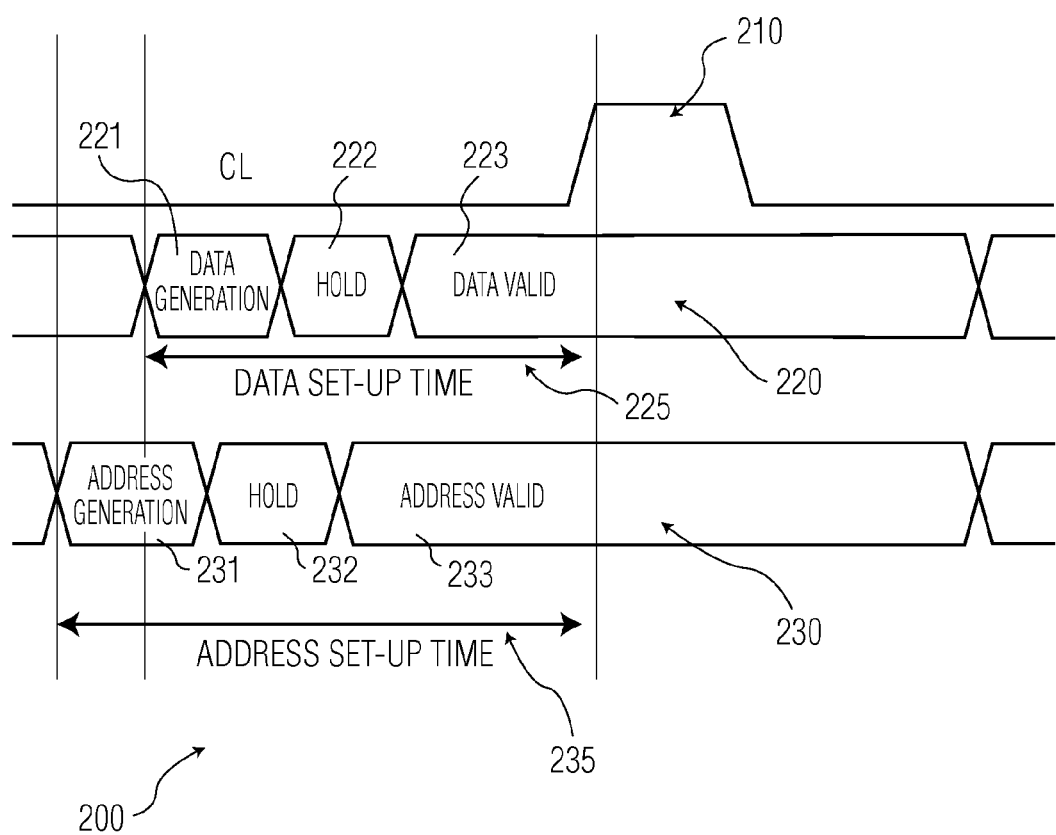
FIG. 2 is a diagram schematically illustrating address and data set-up time in a BIST.

The BIST generates data with corresponding addresses and runs consecutive write and read operations in increasing and decreasing address order. In case of read operation, an output analyzer of the BIST compares the read out data with predetermined logic values. If the read out data match the logic values, the memory is fault free, otherwise, the memory is faulty. Refer to FIG. 2. FIG. 2 illustrates the wave forms of the data and address generation 221, 231 in relation to a signal provided by a test clock CL. Address and data set-up time are defined as the time between address generation (222, 223) and data generation (232, 233) and a positive edge of the test clock CL.

Figure 1:
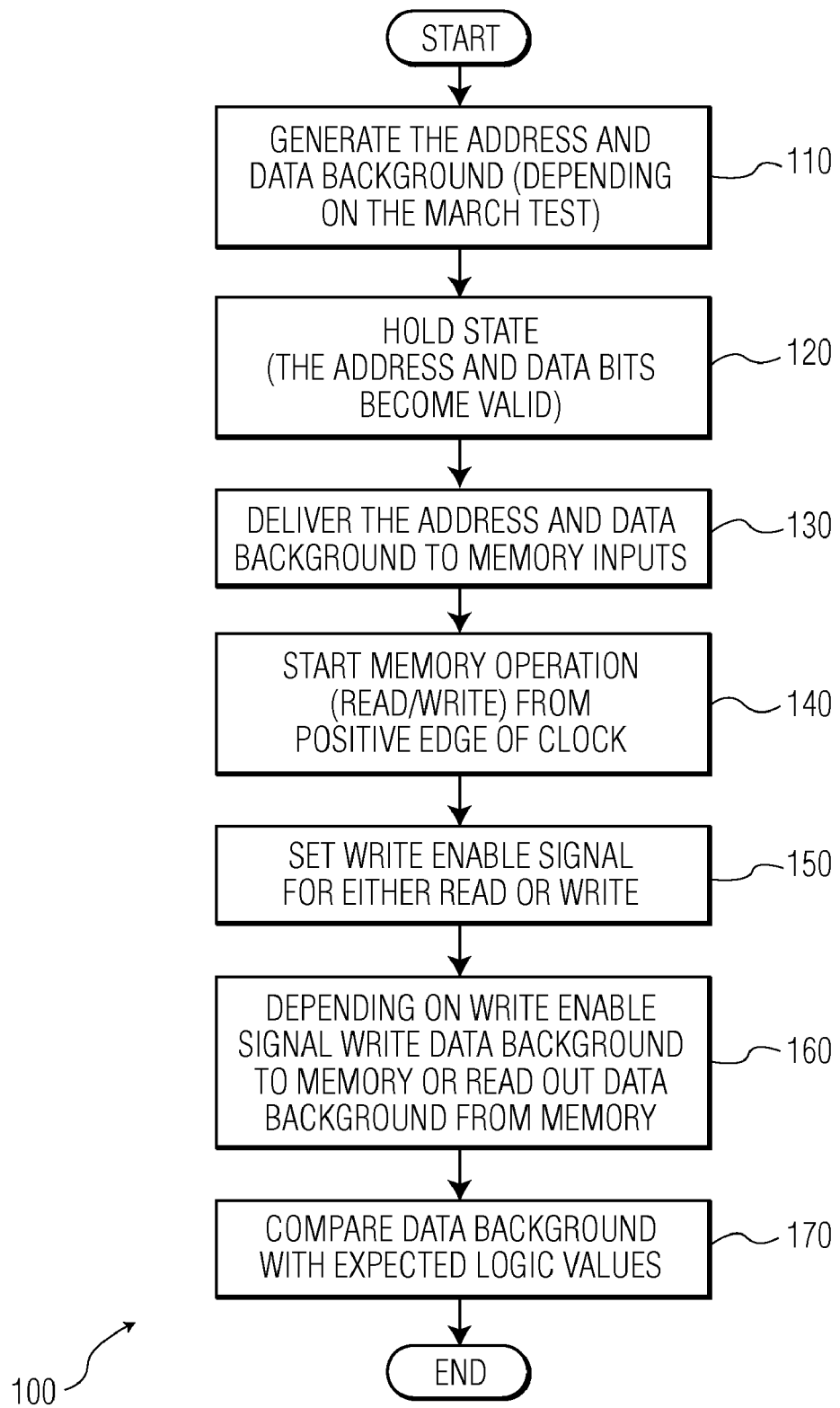
FIG. 1 is a flowchart of testing of the memory according to an embodiment of the present invention.

The process steps 100 of the BIST are shown in FIG. 1. Depending upon the march test, the BIST generates the address and data backgrounds 110. The BIST holds the state of the memory in order for the data bits and the address bits to become valid 120. The address and data background are delivered to the memory inputs 130. Using a positive/negative edge of the test clock, memory operation is begun 140. The memory operation may either be a read or a write. Depending upon the write enable signal, the data background is either written to the memory or is read out from the memory 160. The read out data is compared with predetermined logic values 170.

The above steps are repeated depending on the complexity of the test patterns and the memory size. The end of testing is reported by the BIST when a ready signal is delivered together with a second flag indicating the tested device being fault free or faulty.

FIG. 2 shows the waveforms of the address generation 230 and data generation 220 with the memory clock (CL) 210. The setup time 225, 235 for the address and data is the time (which includes a hold time 222, 232 and data valid interval 223, 233) that exists between the address and data background generation (221, 231) and the positive/negative edge of the clock.

Generally, the address and data generation is performed at a lower frequency than the operating frequency of present semiconductor memories. Thus, delay faults are masked when the test patterns—address bits and data bits—are delivered to the memory inputs for a relatively long time before the start of the memory operation—positive/negative edge of the clock signal. A BIST operating at 50 MHz needs 20 ns for generating address bits and data bits, and data comparison for the output analyzer in case of a read operation. Therefore, approximately 10 ns are needed to generate and deliver a set of address bits and data bits to the memory inputs. For example, a semiconductor memory is operating at 2 ns clock cycle, if the address bits and data bits are delivered to the memory approximately 10 ns before the positive/negative edge of the clock signal, the periphery circuitry of the memory is already in a substantially stable state before the positive/negative edge of the clock signal. Therefore, a delay fault caused by a defect in the memory periphery is not detected during application of the test pattern due to a delay of 10 ns before the positive/negative edge of the clock signal masking the delay fault.

Nowadays, the memories are self-timed, i.e. an internal clock for controlling the read/write operation is generated based on the positive/negative edge of an external clock signal. The self-timing techniques avoid incomplete read/write operations to occur. For testing delay faults, the state of the memory circuit before the positive/negative edge of the internal clock is critical. Small delay faults are detected when the state of the memory circuit is not yet stable due to the delay fault. When the positive/negative edge of the external clock signal is on time, the internal clock signal of the memory is generated and the memory circuit is still not yet stable. Thus, the delay fault has an impact on the memory behavior and is detected. Therefore, the time interval separating the positive/negative clock edge and the delivery of the memory inputs is critical. When the time interval between the provision of the address bits and data bits and the positive/negative clock edge is large compared to the memory clock cycle then address decoder, write circuitry, sense amplifiers, pre-charge and discharge circuitry are already stable before the positive/negative clock edge initiates the read/write operation.

Figure 3:
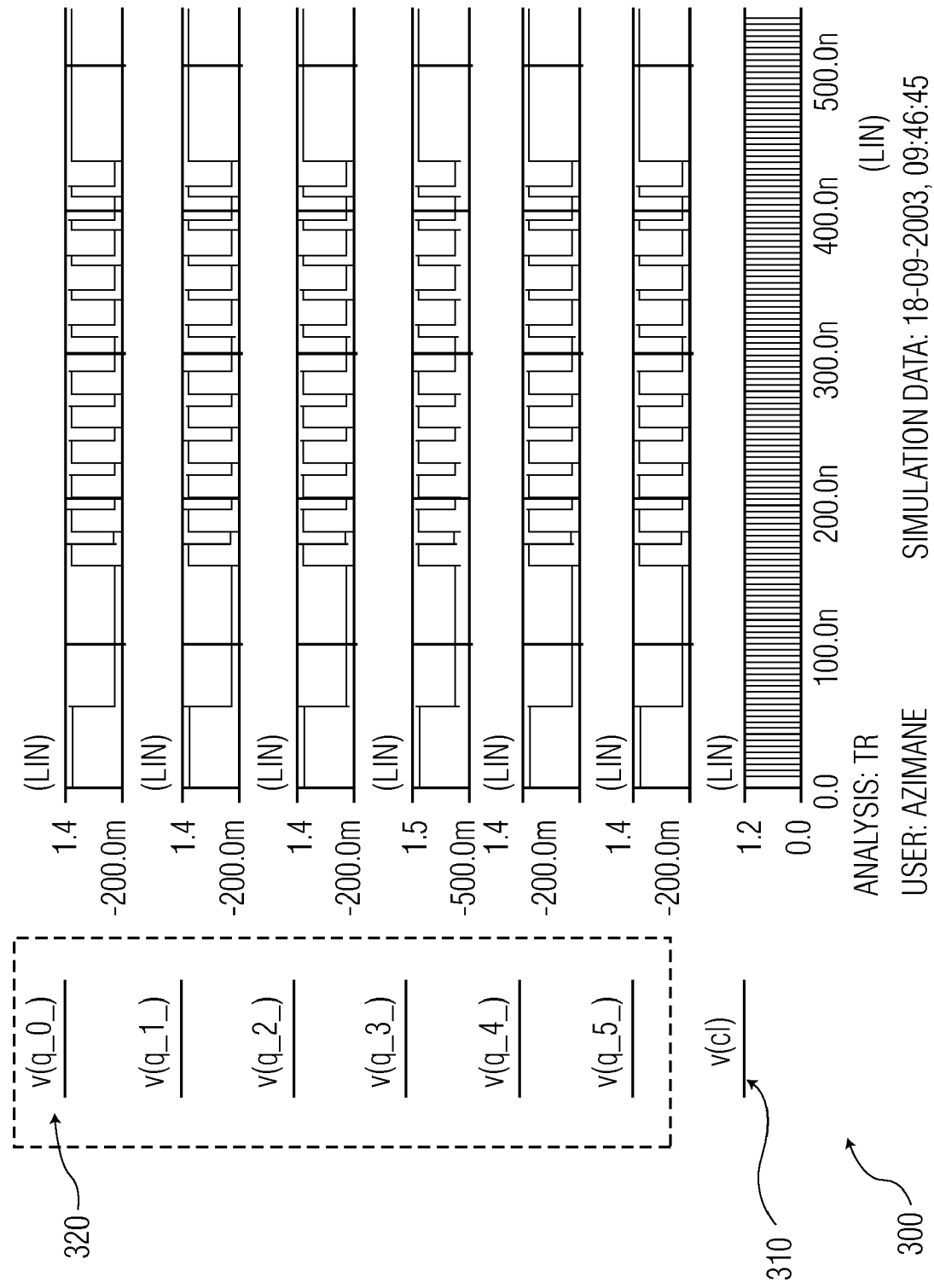
FIG. 3 is a diagram schematically illustrating simulation results of a semiconductor memory test.

Referring to FIG. 3, a simulation result 300 of a march test of a memory with six output 320 pins q[0, . . . ,5] is shown. The memory operates at 2 ns clock cycle, while the BIST performs the March test at 50 MHz-20 ns clock cycle. Thus the address and data set-up time is approximately 10 ns. The output pins 320 and the clock 310 are plotted.

Figure 4:
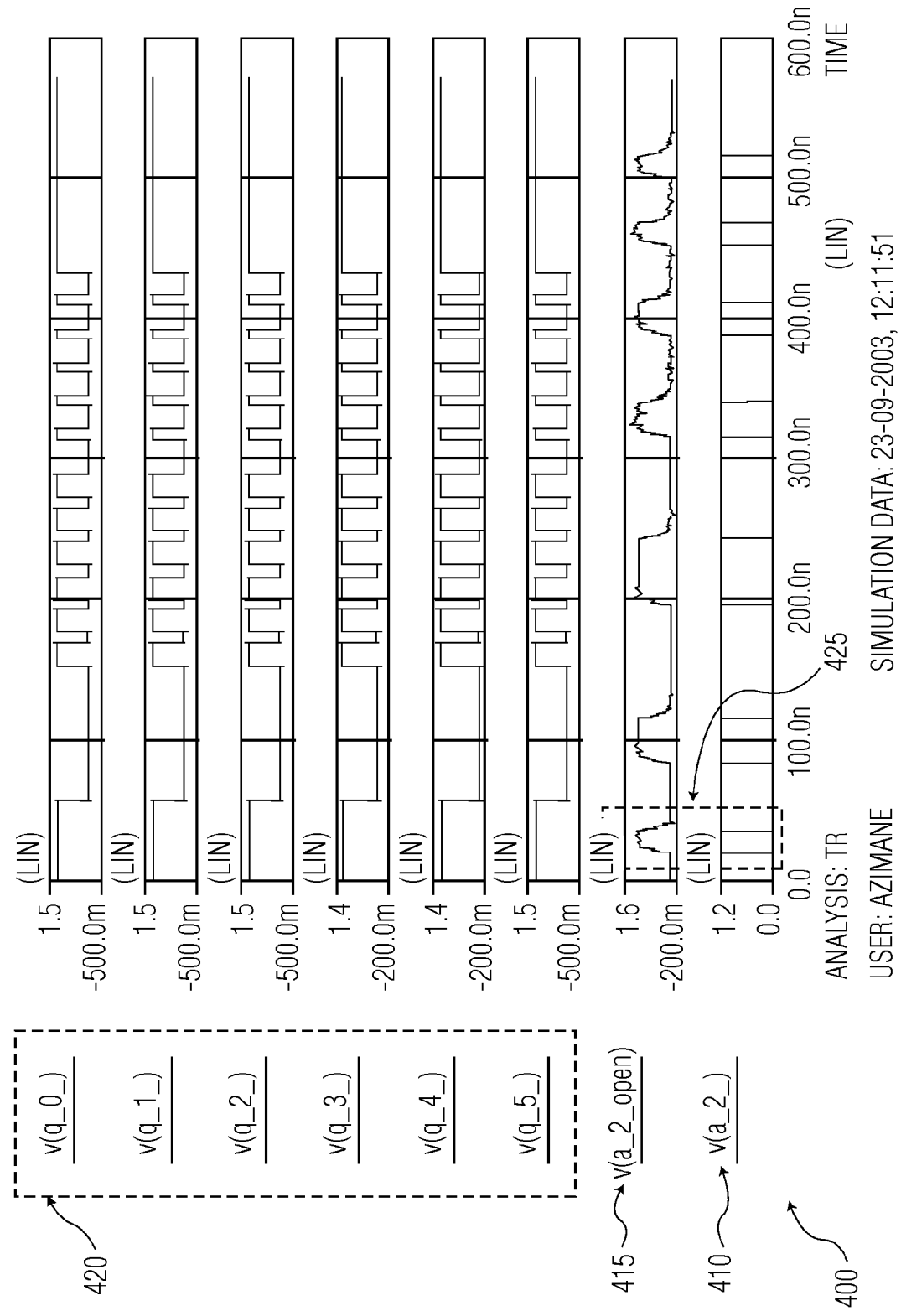
FIG. 4 is a diagram schematically illustrating simulation results of a semiconductor test with an injected open defect at the least significant bit of the X address decoder.
Figure 5:
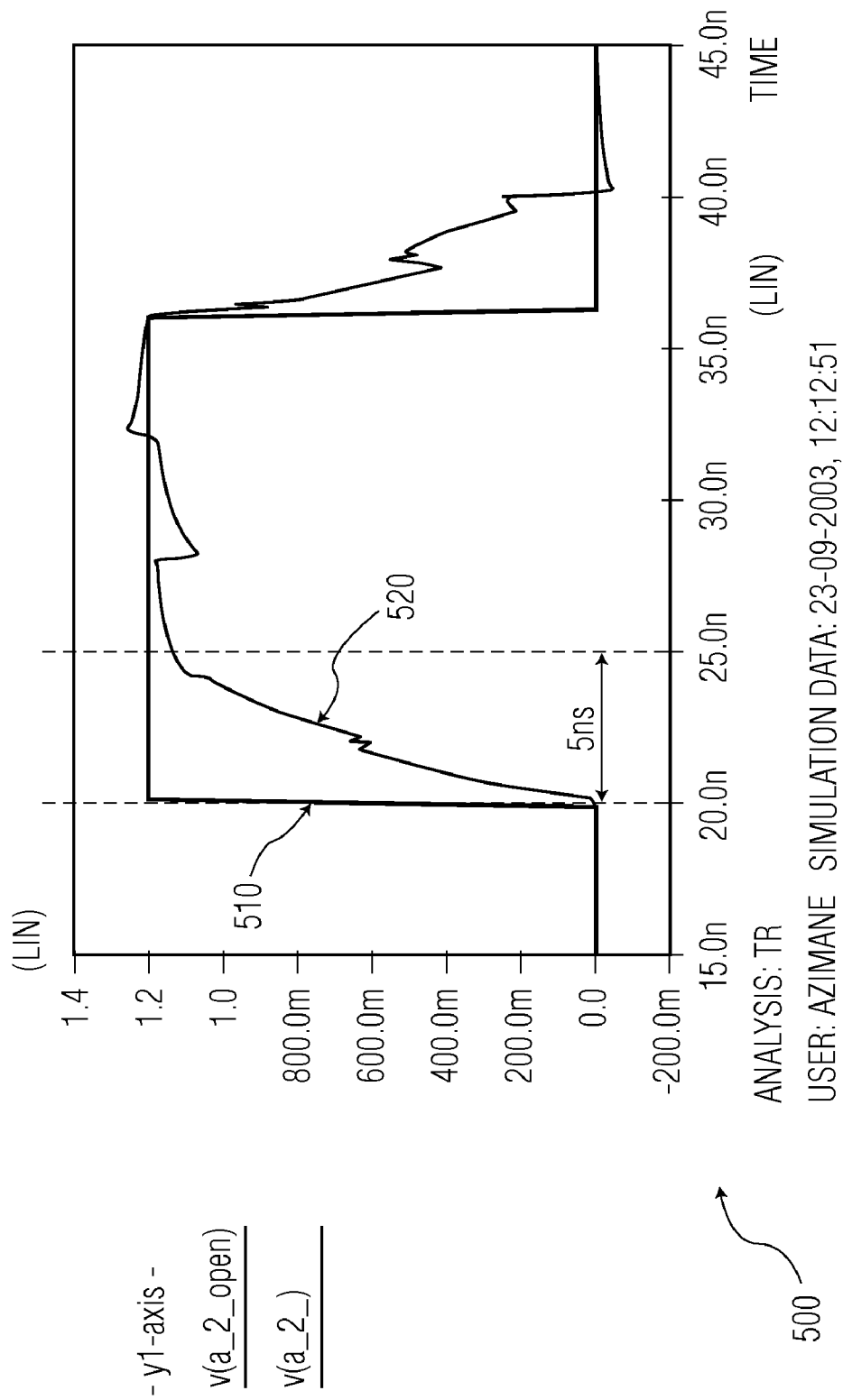
FIG. 5 is a diagram schematically illustrating an enlarged portion of the diagram shown in FIG. 4.

FIG. 4 illustrates the simulation results 400 performed under same conditions with an injected open defect at the least significant bit of the X address decoder. This open defect results in a slow-to-rise fault indicated in the waveform 415 of the V(a_2_open) diagram. The slow-to-rise fault 425 is more clearly visible in the enlarged section shown in FIG. 5. The pin $a_{13}$ 2_reaches 410 the logic value of one with a delay of 5 ns, while the memory operates at 2 ns clock cycle. However, this defect is not detected when the BIST is operated at a frequency lower than the operating frequency of the semiconductor memory. Referring to FIG. 5, the slow-to-rise fault 425 is zoomed in the plot 500, pin a_2_(510) is a pin without resistive defects. Pin a_2_open (520) reaches a logic-one 5 ns later.

In a method for detecting delay faults in semiconductor memories according to an embodiment of the present invention, the time between the delivery of the address bits and the data bits to the memory inputs and the start of the memory operation is reduced either by shifting the positive/negative clock edge or the address and data validation in order to detect delay faults.

In another method for detecting delay faults in semiconductor memories according to the present invention data bits and address bits are generated depending on a test pattern such as a march test. The address bits and data bits are then validated. After the validation the address bits and data bits are then delivered to the memory inputs. The positive/negative edge of the test clock starts memory operation—read or write—depending on a write enable signal. The delivery of the address bits and data bits and the start of the memory operation are timed such that a time interval therebetween is approximately equal to an operating clock cycle of the semiconductor memory. The appropriate time interval is obtained by appropriate timing of the address and data validation or, alternatively, by appropriate timing of the positive/negative edge of the test clock. In case of a read memory operation the data bits are read out of the memory and compared with predetermined logic values. The above steps are repeated by generating data bits and address bits and running consecutive write and read operations in, for example, increasing or decreasing address order. In case of a delay fault free memory the read out data bits match the predetermined values; otherwise if, for example, one data bit does not match the predetermined value, the memory is determined to be faulty.

The above method for detecting delay faults in semiconductor memories is highly advantageous, enabling delay fault detection using a BIST operating at a frequency below the operating frequency of the semiconductor memory. For instance, a semiconductor memory operating at 200 MHz needs to be tested at the same frequency or smaller delay faults are not detected. Testing the semiconductor memory at 50 MHz or even 150 MHz using a conventional BIST does not enable detection of small delay faults. By timing the delivery of the address bits and data bits and the start of the memory operation such that the time interval therebetween is approximately equal to the operating clock cycle of the semiconductor memory, both the address decoder and the read/write circuitry are stressed in time appropriately, enabling detection of small delay faults. Furthermore, the method according to the invention is also applicable for testing self-timed semiconductor memories using the positive/negative edge of the internal memory clock signal.

This obviates a need for operation of the BIST at the operating frequency of the memory, substantially reducing the BIST area of a memory chip. In an embodiment the BIST is implemented such that it is operating at a maximum possible frequency—maximum possible trade off area—and the frequency gap between the BIST frequency and the operating frequency of the memory is then compensated by appropriate timing of the delivery of the address bits and data bits and the start of the memory operation.

Figure 6:
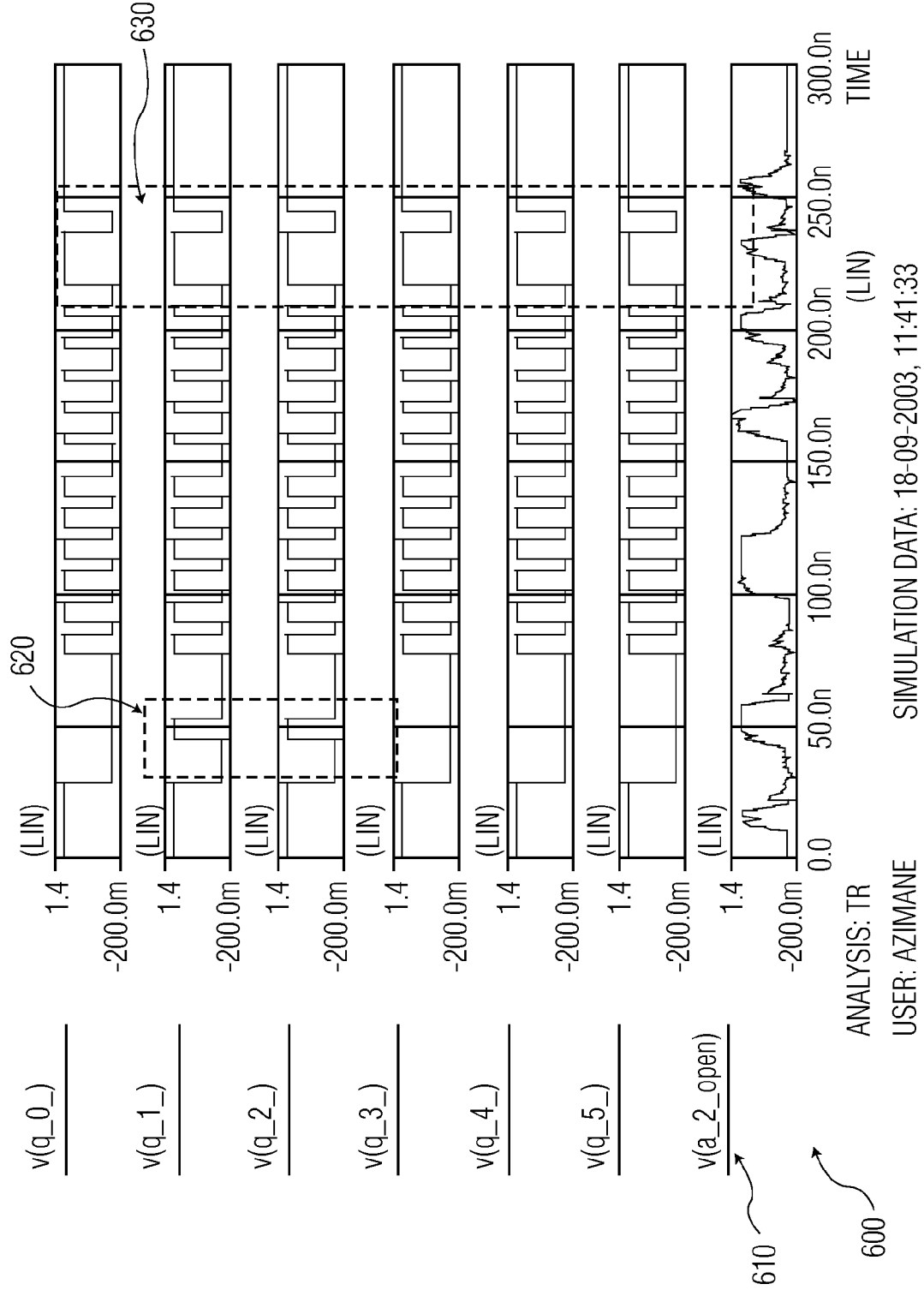
FIG. 6 is a diagram schematically illustrating simulation results of a semiconductor test using the method according to the invention.

FIG. 6 illustrates a simulation similar to that of FIG. 4 with the timing arranged according to an embodiment of the present invention. The simulation 600 shows that the delay fault is detected when the appropriate timing of the delivery of the address bits and data bits and the start of the memory operation is applied. The memory outputs q_1 and q_2 provide unexpected logic values 620 at 50 ns, while all memory outputs provide incorrect logic values 630 at 240 ns.

The method according to the invention is easily implemented in conventional BIST circuitry or tester circuitry enabling operation of the BIST or the tester at a lower frequency than the operating frequency of the memory under test while enabling detection of small delay faults.

Numerous other embodiments of the invention will be apparent to persons skilled in the art without departing from the spirit and scope of the invention as defined in the appended claims.

The invention claimed is:

1. A method for detecting delay faults in a semiconductor memory comprising:
   providing address bits and data bits according to a test pattern suitable for testing the semiconductor memory;
   providing the address bits and the data bits to input ports of the semiconductor memory; and,
   starting memory operation in dependence upon the address bits, wherein a time interval between the provision of both the address bits and the data bits and the start of the memory operation is approximately equal to an operating clock cycle of the semiconductor memory.

2. A method for detecting delay faults in a semiconductor memory as recited in claim 1 wherein providing address bits and data bits includes:
   generating address bits and data bits; and,
   validating the address bits and the data bits prior to providing same to the input ports of the semiconductor memory.

3. A method for detecting delay faults in a semiconductor memory as recited in claim 1 wherein the memory operation comprises writing the data bits into the semiconductor memory.

4. A method for detecting delay faults in a semiconductor memory as recited in claim 3 wherein the memory operation comprises reading data bits out of the semiconductor memory.

5. A method for detecting delay faults in a semiconductor memory as recited in claim 4 further comprising:
   repeating the steps according to the test pattern.

6. A method for detecting delay faults in a semiconductor memory as recited in claim 5 further comprising:
   comparing read out data wit predetermined data to obtain at least a comparison result; and,
   if the at least a comparison result is indicative of a match providing a signal indicating that the semiconductor memory is fault free.

7. A method for detecting delay faults in a semiconductor memory as recited in claim 6 wherein the time interval is determined by appropriate timing of the address and data validation.

8. A method for detecting delay faults in a semiconductor memory as recited in claim 6 wherein the time interval is determined by appropriate timing of the start of the memory operation.

9. A method for detecting delay faults in a semiconductor memory as recited in claim 6 wherein the test pattern is a March test.

10. A method for detecting delay faults in a semiconductor memory comprising:
   providing valid address bits and data bits according to a test pattern suitable for testing the semiconductor memory;
   providing the valid address bits and the valid data bits to input ports of the semiconductor memory;
   writing the valid data bits into the semiconductor memory in dependence upon the valid address bits, wherein a time interval between the provision of both the valid address bits and the valid data bits and start of the write operation is approximately equal to an operating clack cycle of the semiconductor memory;
   providing second valid address bits according to the test pattern;
   providing the second valid address bits to the input ports of the semiconductor memory;
   reading second data bits out of the semiconductor memory in dependence upon the second valid address bits, wherein a time interval between the provision of the second valid address bits and start of the read operation is approximately equal to an operating clock cycle of the semiconductor memory; and,
   comparing the second data bits with predetermined data to obtain a comparison result and if the comparison result is indicative of a match indicating that the operation was fault free.

11. A method for detecting delay faults in a semiconductor memory as recited in claim 10 wherein providing valid address bits and valid data bits includes:
   generating address bits and data bits; and,
   validating the address bits and the data bits to provide the valid address bits and the valid data bits; and,
   wherein providing second valid address bits includes:
   generating second address bits according to the test pattern;
   validating the second address bits to provide second valid address bits.

12. A method for detecting delay faults in a semiconductor memory as recited in claim 10 comprising:
   repeating the steps according to the test pattern.

13. A method for detecting delay faults in a semiconductor memory as recited in claim 12 wherein the test pattern is a march test.

14. A meted for detecting delay faults in a semiconductor memory as recited in claim 13 wherein the time interval is determined by appropriate timing of the address and data validation.

15. A method for detecting delay faults in a semiconductor memory as recited in claim 13 wherein the time interval is determined by appropriate timing of the start of the memory operation.

16. A test circuitry for detecting delay faults in a semiconductor memory comprising:
   address and data generating circuitry for generating address bits and data bits according to a test pattern suitable for testing the semiconductor memory;
   connecting circuitry in communication with the semiconductor memory for providing the address bits and the data bits to the semiconductor memory; and,
   timing circuitry for providing a time signal for timing the provision of the address bits and the data bits and start of the memory operation such that a time interval between the provision of both the address bits and the data bits and the start of the memory operation is approximately equal to an operating clock cycle of the semiconductor memory.

17. A test circuitry for detecting delay faults in a semiconductor memory as recited in claim 16 comprising:
   validation circuitry for validating the address bits and the data bits.

18. A test circuitry for detecting delay faults in a semiconductor memory as recited in claim 16 comprising comparison circuitry for comparing read out data with predetermined data to obtain a comparison result and if the comparison result is indicative of a match indicating that the operation was fault free.

19. A test circuitry for detecting delay faults in a semiconductor memory as recited in claim 18 wherein the address and data generating circuitry, the validation circuitry, the connecting circuitry, the timing circuitry, and the comparison circuitry are integrated within a chip comprising the semiconductor memory.

* * * * *